(12) United States Patent
Marchant et al.

(10) Patent No.: US 6,353,502 B1
(45) Date of Patent: Mar. 5, 2002

(54) VCSEL FIELD CORRECTION

(75) Inventors: Alan B. Marchant, Fairport; Eugene G. Olczak, Rochester, both of NY (US)

(73) Assignee: Eastman Kodak Company, Rochester, NY (US)

( * ) Notice: Subject to any disclaimer, the term of this patent is extended or adjusted under 35 U.S.C. 154(b) by 33 days.

(21) Appl. No.: 09/593,105

(22) Filed: Jun. 13, 2000

(51) Int. Cl.[7] .......................... G02B 27/10; G02B 27/30
(52) U.S. Cl. ..................... 359/626; 359/619; 359/641
(58) Field of Search ............................. 359/618–624, 359/641, 796, 626

(56) References Cited

U.S. PATENT DOCUMENTS

| | | | |
|---|---|---|---|
| 4,428,647 A | | 1/1984 | Sprague et al. ............... 359/20 |
| 5,745,153 A | | 4/1998 | Kessler et al. .............. 347/241 |
| 5,802,092 A | * | 9/1998 | Endriz .......................... 372/50 |
| 5,808,986 A | | 9/1998 | Jewell et al. ............ 369/44.37 |
| 5,857,042 A | * | 1/1999 | Robertson et al. ............ 385/33 |
| 5,969,872 A | * | 10/1999 | Oren et al. ................. 359/621 |

* cited by examiner

Primary Examiner—Jordan M. Schwartz
(74) Attorney, Agent, or Firm—Raymond L. Owens

(57) ABSTRACT

Apparatus for collimating multiple laser beams from a Vertical Cavity Surface Emitting Laser (VCSEL) array and directing the collimated beams through a common aperture includes a VCSEL array including at least two VCSEL sources disposed in a spatial pattern and each VCSEL source emitting a divergent laser beam; a microlens array with lenslet elements disposed in a spatial pattern geometrically similar to the pattern of sources on the VCSEL array, said lenslet pattern being scaled to a smaller dimension than the VCSEL source pattern and arranged to receive the divergent laser beams; and the microlens array being arranged so that the lenslet surface of the microlens array is maintained at a distance from the VCSEL array substantially equal to the focal length of the lenslets to substantially collimate the beams and also being maintained in a lateral orientation so that each beam passes through a corresponding microlens in the microlens array causing the laser beam from each VCSEL source to be directed through a common aperture.

6 Claims, 3 Drawing Sheets

42    display screen (Prior Art)

VCSEL FIELD CORRECTION

FIELD OF THE INVENTION

This invention relates to Vertical Cavity Surface Emitting Laser (VCSEL) arrays which are particularly suitable for optical tape recording.

BACKGROUND OF THE INVENTION

A Vertical Cavity Surface Emitting Laser (VCSEL) can be configured to produced multiple, independent laser beams. The laser beams emerge as divergent beams from well defined apertures on the VCSEL device surface.

The VCSEL may be used as a source for multichannel recording, printing, optical data processing, or image display by imaging the VCSEL surface onto a medium of interest. However, the apertures of independent VCSEL sources are usually not formed closer together than about 75 μm. Otherwise, electronic and optical cross-talk occurs. Since the VCSEL apertures are much smaller than the minimum spacing, when the source array is imaged onto a medium, the spots are also widely spaced.

FIG. 1 shows a prior art arrangement of a Vertical Cavity Surface Emitting Laser Array 10 having four independent VCSEL elements 12a–d. Each VCSEL element emits an uncollimated beam of laser light perpendicular to the VCSEL array surface. Because of limitations inherent in VCSEL technology, the emitting regions of the VCSEL elements cannot be arranged adjacent to each other, but must be arranged with some minimum spacing between nearest neighbors.

The light from the VCSEL array is collected by a focusing lens 14 and focused at a focal plane 16 where the light from the VCSEL elements 12a–d forms focused spots 18a–d, respectively. The pattern of illuminated spots at the focal plane is an image of the VCSEL array surface. Correspondingly, the focused spots are not adjacent to each other, but are arranged in a pattern that is geometrically similar to the pattern of laser elements on the VCSEL array.

From U.S. Pat. No. 4,428,647 it is known that this limitation on spacing of the focused spots from a laser array such as a VCSEL array can be solved by providing a complementary microlens array aligned to the laser array. The microlens array provides one lenslet focused on each VCSEL source, with lenslet diameters approximately equal to the VCSEL source spacing. In the apparatus of FIG. 2, a microlens array 20 is combined with the VCSEL array 10. The microlens array includes lenslets 22a–c arranged in a pattern with the same dimensions as the pattern of VCSEL elements 12a–c on the VCSEL array. However, the lenslets are larger in extent than the VCSEL elements, large enough to be adjacent on the surface of the microlens array.

The lenslet surface of the microlens array is spaced from the VCSEL array surface by a distance equal to the lenslet focal length. And each flenslet is position exactly above its corresponding VCSEL element. The divergent laser beam from VCSEL element 12a is collected and collimated by lenslet 22a. Similarly, the laser beams from VCSEL elements 12b and 12c are collected and collimated by lenslets 22b and 22c, respectively. The independent collimated laser beams 24a–c emitted through the lenslets are slightly divergent, because of optical diffraction through the lenslet apertures. But because the lenslets are substantially larger than the VCSEL elements, the divergence of the collimated laser beams is much smaller than the divergence immediately after the VCSEL elements.

The collimated laser beams are focused by a focusing lens 14 onto a focal plane 16 forming a set of focused spots 18a–c illuminated by the VCSEL elements 12a–c. The pattern of illuminated spots at the focal plane is an image of the microlens array. Therefore, the focused spots are essentially adjacent, with the same spatial pattern as the lenslets.

In order to create focused spots that are as small as possible, it is necessary to use a focus lens with a short focal length. The apparatus of FIG. 3 includes a smaller focus lens 14' with short focal length to focus the laser beams 24a–c from a VCSEL array 10 collimated by a matched microlens array 20. Just as in FIG. 2, the VCSEL elements 12a–c each illuminate a separate focused spot 18a–c. But in FIG. 3, the spots are smaller and closer together, because the focus lens has a shorter focal length. However, because the focus lens 14' has a smaller diameter than focus lens 14 in FIG. 2, the laser beams 24a and 24c from the outlying VCSEL sources 12a and 12c are not collected in their entirety by the focus lens. Hence, the illumination of the corresponding focused spots 18a and 18c is reduced by apodization. To collect all of the light from a large microlens array, the focusing lens diameter must be oversized by approximately the size of the VCSEL array compared to the lens size required to focus a single source. For applications that require very small focused spots, it may be impractical to provide such a large focusing lens.

A previously known solution to correct beam inefficiency due to apodization at the focus lens aperture is to provide a field lens or other external optics to steer the laser beams from all the VCSEL elements together at the objective lens aperture (see commonly assigned U.S. Pat. No. 5,745,153 and U.S. Pat. No. 5,808,986). FIG. 4 shows a positive field lens 26 combined with the VCSEL array 10 and matched microlens array 20. The field lens deflects the outlying laser beams 24a and 24c so that they converge with the central laser beam 24b at the aperture of a short focal length focus lens 14'. The laser beams form focused spots 18a–c. The positions and sizes of these spots are essentially unaffected by the field lens 26. And the outlying focused spots 18a and 18c have full intensity because laser beams 24a and 24c are not apodized at the focus lens. However, incorporation of a field lens results in a relatively complex optical structure.

SUMMARY OF THE INVENTION

It is an object of the present invention to produce an apparatus which makes use of a VCSEL array and which uses simplified optics.

This object is achieved by apparatus for collimating multiple laser beams from a Vertical Cavity Surface Emitting Laser (VCSEL) array and directing the collimated beams through a common aperture, comprising:

a) a VCSEL array including at least two VCSEL sources disposed in a spatial pattern and each VCSEL source emitting a divergent laser beam;

b) a microlens array with lenslet elements disposed in a spatial pattern geometrically similar to the pattern of sources on the VCSEL array, said lenslet pattern being scaled to a smaller dimensions than the VCSEL source pattern and arranged to receive the divergent laser beams; and c) the microlens array being arranged so that the lenslet surface of the microlens array is maintained at a distance from the VCSEL array substantially equal to the focal length of the lenslets to substantially collimate the beams and also being maintained in a lateral orientation so that each beam passes through a corresponding microlens in the microlens array causing the laser beam from each VCSEL source to be directed through a common aperture.

In accordance with the invention, the microlens array itself may be adapted to steer the individual beams together at the objective lens aperture, eliminating the need of a field lens. The microlens elements are spaced slightly closer together than the VCSEL elements. Thus, the microlenses near the edge of the array work slightly off-axis and deflect the outer beams inward to common aperture. The requisite spacing change is approximately equal to the VCSEL source pitch times the ratio of the microlens focal length to the distance from the VCSEL assembly to the common aperture.

This invention is useful for any application in which an array of spaced, independent light sources is combined using a microlens array to form a close spaced array of focused light beams. By spacing the microlens elements closer together than the sources, the beams are substantially coincident at the aperture of a common focusing lens.

DETAILED DESCRIPTION OF THE INVENTION

Figure 1:
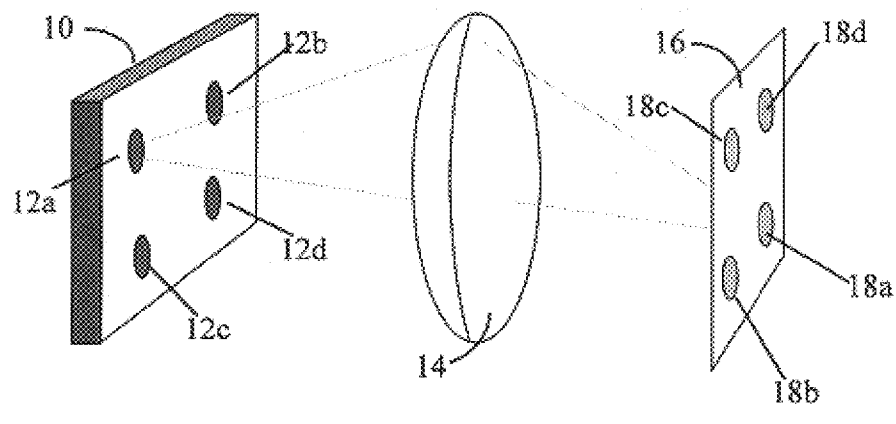
FIG. 1 shows a prior art apparatus having Vertical Cavity Surface Emitting Laser Array with four independent VCSEL elements.
Figure 2:
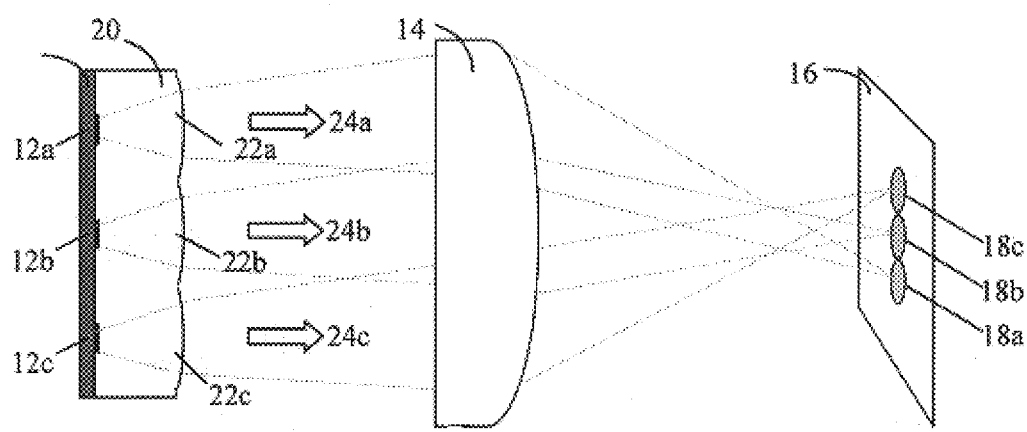
FIGS. 2–4 also show prior art apparatus which also use Vertical Cavity Surface Emitting Laser Arrays in combination with microlens arrays.
Figure 3:
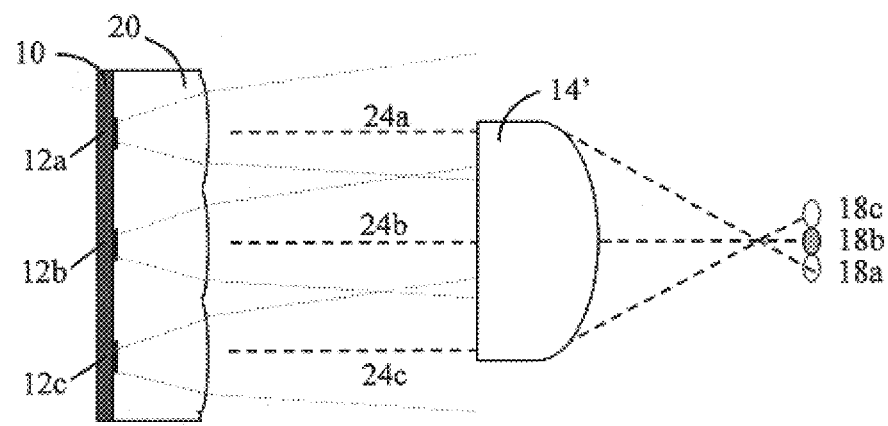
Figure 4:
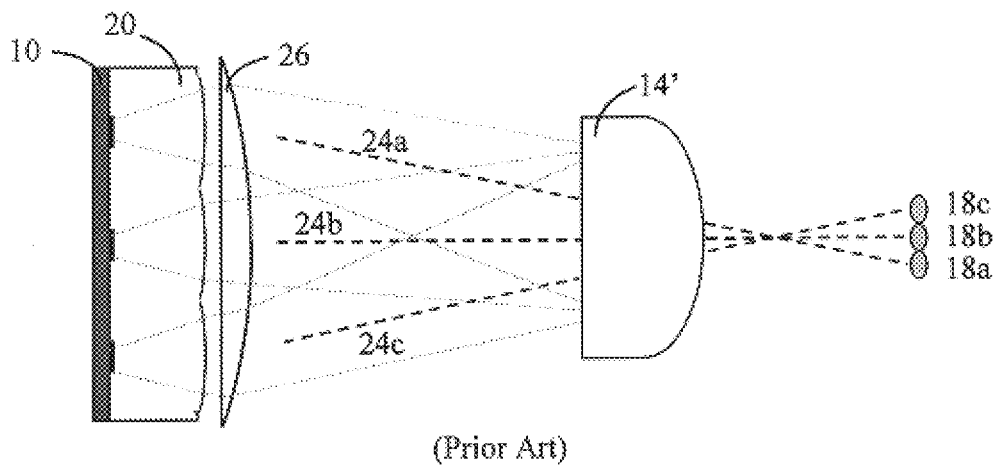

Where elements correspond to those in the FIGS. 1–4, the same reference numerals will be used for convenience of illustration.

Figure 5:
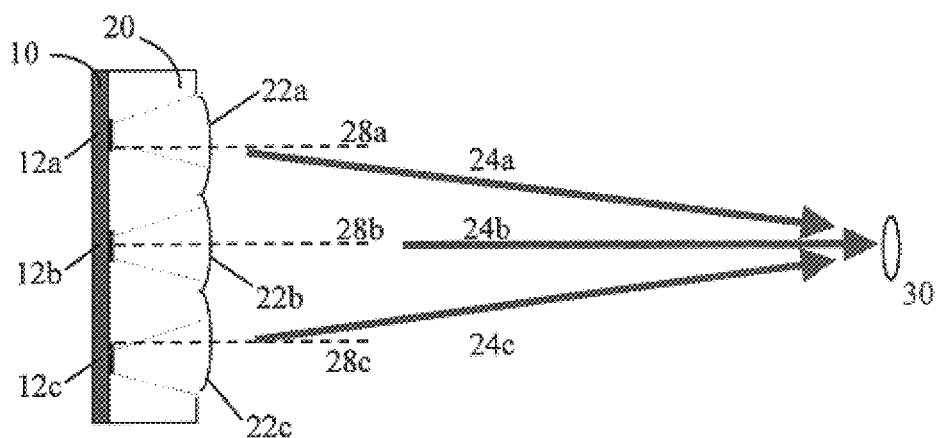
FIGS. 5–8 show different embodiments of apparatus in accordance with the present invention.

The object of this invention is to efficiently focus the collimated beams from a VCSEL array without adding a separate field lens component. In accordance with the present invention, this can be accomplished by modifying the microlens array. FIG. 5 shows a VCSEL array 10 with VCSEL elements 12a–c aligned to a microlens array 20 in which the lenslets 22a–c are arranged with a slightly closer pitch than the VCSEL array. The optical axis 28b of lenslet 22b passes through VCSEL element 12b, so the resulting laser beam 24b is collimated normal to the microlens array and VCSEL array surfaces. However, VCSEL elements 12a and 12c are decentered to the outside of the optical axes 28a and 28c of lenslets 22a and 22c. Therefore, laser beams 24a and 24c which are collimated by lenslets 22a and 22c are deflected inward, towards laser beam 24b. The collimated laser beams cross at a convergence point where an aperture 30 is located. If this convergence point is the aperture of a focusing lens (or if the convergence point is imaged onto the aperture of the focusing lens), all the light from all the laser beams may be focused through the lens simultaneously.

Figure 6:
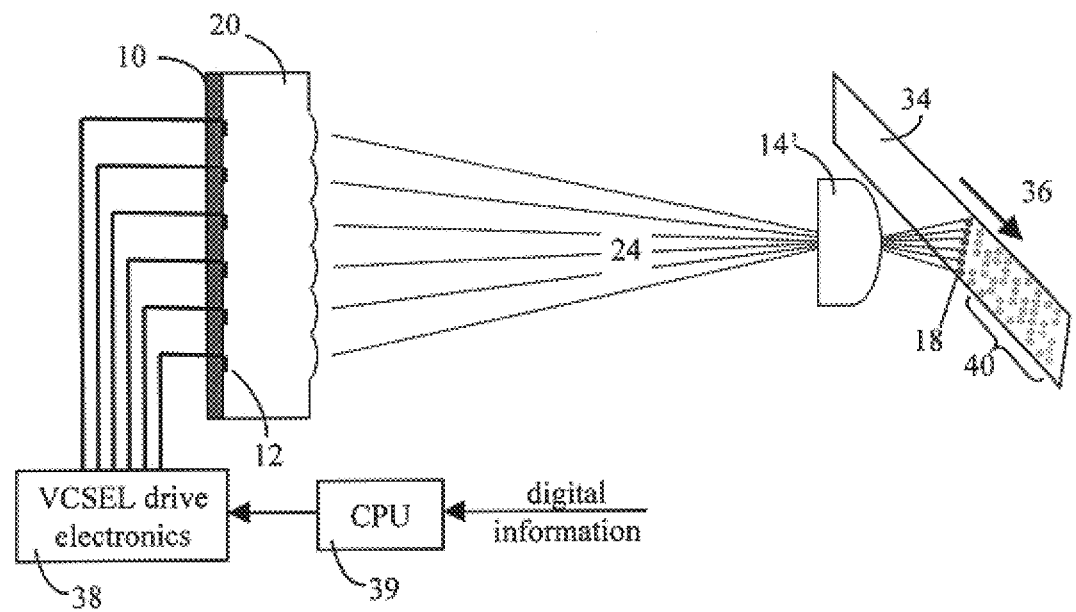

An application of this invention for data recording is illustrated in FIG. 6. A linear array 10 of VCSEL elements 12 is collimated by a microlens array 20 scaled to direct the collimated laser beams 24 through the aperture of a short focal length lens 14'. The laser beams form a close-spaced line of spots 18 focused on the surface of an optical recording medium 34. As the recording medium scans in the direction 36, the VCSEL elements are modulated by VCSEL drive electronics 38, driven by a digital data controller such as the depicted central processing unit (CPU) 39, in response to a digital information input. VCSEL modulation produces intensity modulation of the focused spots, resulting in multiple tracks of recorded marks 40 one track from each focused spot. It will be appreciated that FIG. 6 may represent an optical recording system recording digital information on an optical recording medium. A similar apparatus may be utilized to record analog information.

Figure 7:
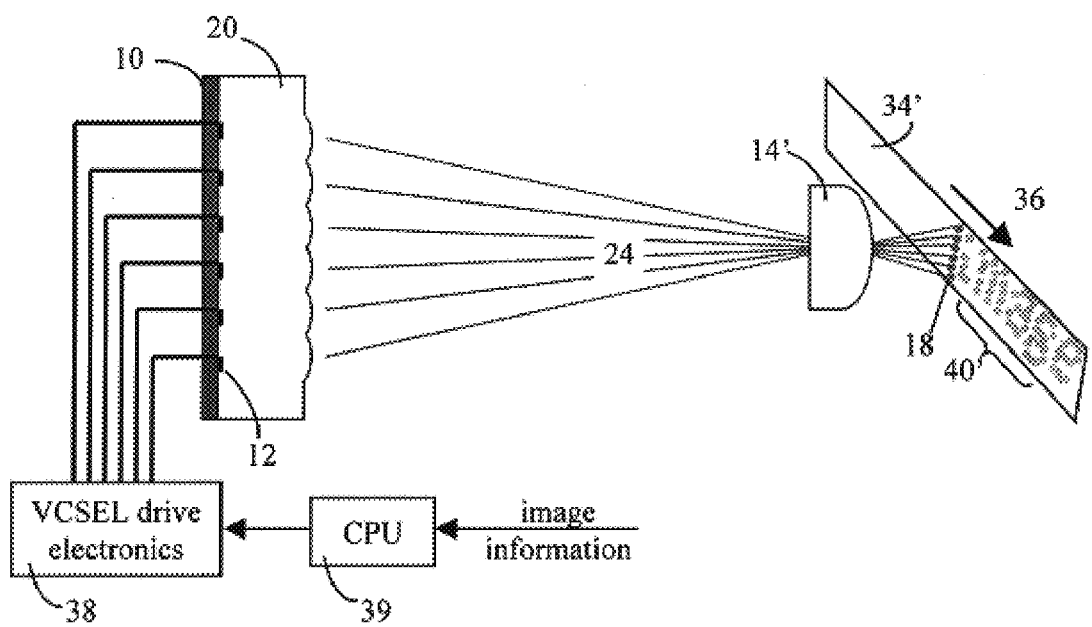

An application of this invention for image printing is illustrated in FIG. 7. A linear array 10 of VCSEL elements 12 is collimated by a microlens array 20, scaled to direct the collimated laser beams 24, through the aperture of a short focal length lens 14'. The laser beams form a close-spaced line of spots 18, focused on the surface of a print receiving medium 34'. As the recording medium scans in the direction 36, the VCSEL elements are modulated by VCSEL drive electronics 38. The VCSEL drive electronics 38 is driven by the CPU 39, in response to an image information input. VCSEL modulation produces intensity modulation of the focused spots, resulting in multiple tracks of recorded marks forming the pixels of a printed image 40'.

Figure 8:
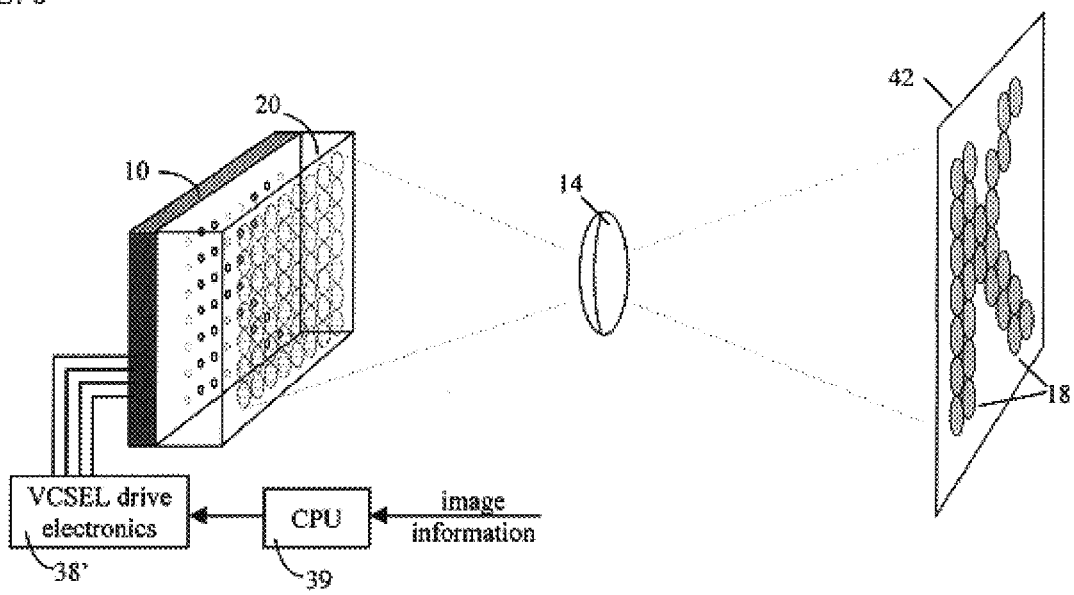

FIG. 8 illustrates how this invention may be utilized in a display application. A two-dimensional VCSEL array 10 is coupled to a microlens array 20, with one lenslet collimating the laser beam from each VCSEL element. The lenslet spacing is less than the VCSEL element spacing, causing the collimated beams to converge on a focusing lens 14, which focuses each laser beam onto a display screen 42. The VCSEL elements are independently driven by VCSEL drive electronics 38', in accordance with image information conditioned by the CPU 39. Each active VCSEL element illuminates one of the focused spots 18, forming an image pixel on the display screen. The displayed image includes a dense array of pixels, rather than the sparse illumination pattern present at the VCSEL array. The effect of the microlens array is to efficiently relay the light from each VCSEL element through the focusing lens to the corresponding display point to form a dense array of image display pixels.

The invention has been described in detail with particular reference to certain preferred embodiments thereof, but it will be understood that variations and modifications can be effected within the spirit and scope of the invention.

PARTS LIST

10 VCSEL array
12 VCSEL elements
12a VCSEL element
12b VCSEL element
12c VCSEL element
12d VCSEL element
14 focusing lens
14' short focal length focusing lens
16 focal plane
18 focused spots
18a focused spot
18b focused spot
18c focused spot
18d focused spot
20 microlens array
22a lenslet
22b lenslet
22c lenslet
24 collimated laser beams
24a collimated laser beam
24b collimated laser beam
24c collimated laser beam
26 field lens 28a lenslet optical axis
28b lenslet optical axis
28c lenslet optical axis
30 aperture
34 recording medium
34' print receiving medium PARTS LIST (con't)

36 media scanning direction
38 VCSEL drive electronics
38' VCSEL drive electronics
39 CPU
40 recorded marks
40' printed image
42 display screen

What is claimed is:

1. Apparatus for collimating multiple laser beams from a Vertical Cavity Surface Emitting Laser (VCSEL) array and directing the collimated beams through a common aperture, comprising:

a) a VCSEL array including at least two VCSEL sources disposed in a spatial pattern and each VCSEL source emitting a divergent laser beam;

b) a microlens array with lenslet elements disposed in a spatial pattern geometrically similar to the pattern of sources on the VCSEL array, said lenslet pattern being scaled to a smaller dimension than the VCSEL source pattern and arranged to receive the divergent laser beams; and c) the microlens array being arranged so that the lenslet surface of the microlens array is maintained at a distance from the VCSEL array substantially equal to the focal length of the lenslets to substantially collimate the beams and also being maintained in a lateral orientation so that each beam passes through a corresponding microlens in the microlens array causing the laser beam from each VCSEL source to be directed through a common aperture.

2. Apparatus as set forth in claim 1 further including:

d) a plurality of data channels adapted to independently modulate the multiple laser beams from the VCSEL array;

e) a focusing lens situated at the common aperture or at an image of the common aperture for focusing each laser beam to a spot on a common focal plane; and f) means for supporting a recording medium at the focal plane.

3. The apparatus of claim 2 further including means for causing relative movement between the recording medium and the focused spots whereby each modulated laser beam records a track of marks on the medium that represents the information carried by the corresponding channel.

4. The apparatus of claim 3 wherein the recording medium includes an optical tape or a print receiving medium.

5. A display apparatus for collimating multiple laser beams from a Vertical Cavity Surface Emitting Laser (VCSEL) array and directing the collimated beams through a common aperture onto a display screen for viewing, comprising:

a) a VCSEL array including at least two VCSEL sources disposed in a spatial pattern and each VCSEL source emitting a divergent laser beam;

b) a microlens array with lenslet elements disposed in a spatial pattern geometrically similar to the pattern of sources on the VCSEL array, said lenslet pattern being scaled to a smaller dimension than the VCSEL source pattern and arranged to receive the divergent laser beams;

c) a projection lens that images the microlens array onto the display screen; and d) the microlens array being arranged so that the lenslet surface of the microlens array is maintained at a distance from the VCSEL array substantially equal to the focal length of the lenslets to substantially collimate the beams and also being maintained in a lateral orientation so that each beam passes through a corresponding microlens in the microlens array causing the laser beam from each VCSEL source to be directed through the projection lens to the display screen.

6. The display apparatus of claim 5 further including:

e) electronic means for driving the output of the elements of the VCSEL array in correspondence with the pixels of an image.

* * * * *